(12) United States Patent
Takeda et al.

(10) Patent No.: US 9,136,566 B2
(45) Date of Patent: Sep. 15, 2015

(54) BATTERY SYSTEM

(75) Inventors: Kenji Takeda, Mito (JP); Koichi Yokoura, Kawasaki (JP); Takashi Takeuchi, Kakubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/391,134

(22) PCT Filed: Jul. 27, 2011

(86) PCT No.: PCT/JP2011/067056
§ 371 (c)(1),
(2), (4) Date: Feb. 17, 2012

(87) PCT Pub. No.: WO2013/014758
PCT Pub. Date: Jan. 31, 2013

(65) Prior Publication Data
US 2014/0147711 A1    May 29, 2014

(51) Int. Cl.
*H01M 10/42* (2006.01)
*H01M 10/48* (2006.01)
*G01R 31/36* (2006.01)
*G01R 19/00* (2006.01)
(Continued)

(52) U.S. Cl.
CPC ............. *H01M 10/482* (2013.01); *G01R 19/00* (2013.01); *G01R 31/36* (2013.01); *H01M 10/0445* (2013.01); *H01M 10/425* (2013.01); *H01M 10/4207* (2013.01); *H02J 7/0021* (2013.01); *H02J 7/0024* (2013.01); *H01M 10/4221* (2013.01); *H01M 2010/4271* (2013.01); *H01M 2010/4278* (2013.01)

(58) Field of Classification Search
None
See application file for complete search history.

(56) References Cited

U.S. PATENT DOCUMENTS

| 6,094,053 A | * | 7/2000 | Harvey | .......................... 324/434 |
| 2003/0129457 A1 | | 7/2003 | Kawai et al. | |
| 2007/0146151 A1 | * | 6/2007 | Yamashita et al. | .......... 340/636.1 |

(Continued)

FOREIGN PATENT DOCUMENTS

| JP | 2003-209932 A | 7/2003 |
| JP | 2008-157808 A | 7/2008 |

(Continued)

OTHER PUBLICATIONS

Machine translation of JP 2008-157808, Jul. 2008.*

(Continued)

*Primary Examiner* — Jonathan Crepeau
(74) *Attorney, Agent, or Firm* — Crowell & Moring LLP

(57) ABSTRACT

A battery pack (21A) according to embodiments of the present invention comprises a plurality of battery modules (11A-11D) connected to each other in either one or both of a series connection mode and a parallel connection mode. An identifying information setting section (25) sets identifying information on each of the plurality of battery elements (11A-11D). A connection mode managing section (47) manages the connection mode between the plurality of battery elements (11A-11D) by using the identifying information set by the identifying information setting section (25). The identifying information on each of the plurality of battery elements (11A-11D) is made up of a combination of first identifying information on the potential of the one of the plurality of battery elements (11A-11D) and second identifying information on the battery pack (21A) serving as a superordinate battery element to which the one of the plurality of battery elements (11A-11D) belongs.

6 Claims, 10 Drawing Sheets

(51) Int. Cl.
*H01M 10/04* (2006.01)
*H02J 7/00* (2006.01)

(56) References Cited

U.S. PATENT DOCUMENTS

| | | |
|---|---|---|
| 2007/0279953 A1 | 12/2007 | Hoff et al. |
| 2008/0203976 A1 | 8/2008 | Ooishi et al. |
| 2009/0009176 A1 | 1/2009 | Nakao |
| 2010/0244847 A1 | 9/2010 | Kudo et al. |
| 2010/0327806 A1 | 12/2010 | Brisebois |
| 2011/0004438 A1* | 1/2011 | Baglino et al. ............... 702/150 |
| 2011/0140533 A1* | 6/2011 | Zeng et al. ..................... 307/80 |
| 2011/0213509 A1* | 9/2011 | Onnerud et al. ............. 700/297 |

FOREIGN PATENT DOCUMENTS

| | | |
|---|---|---|
| JP | 2008-215871 A | 9/2008 |
| JP | 2009-14566 A | 1/2009 |
| JP | 2009-538112 A | 10/2009 |
| JP | 2010-524421 A | 7/2010 |
| JP | 2010-249793 A | 11/2010 |

OTHER PUBLICATIONS

PCT/ISA/237 Form (Three (3) pages).
International Search Report including partial English translation dated Oct. 18, 2011 (Four (4) pages).

* cited by examiner

BATTERY SYSTEM

TECHNICAL FIELD

The present invention relates to a battery system including a plurality of battery elements connected to each other in either one or both of a series connection mode and a parallel connection mode.

BACKGROUND ART

Examples of conventionally known battery systems include one composed of a plurality of battery elements connected in parallel, each of which is composed of a plurality of battery cells connected in series (See, for example, Patent Document 1). A battery system disclosed in Patent Document 1 uses specific address information assigned to each of a plurality of battery elements for detecting the remaining battery capacity of each battery element. The battery system of Patent Document 1 enables highly accurate management of the remaining battery capacities of the plurality of battery elements.

PRIOR ART DOCUMENT

Patent Document

Patent Document 1: Japanese Unexamined Patent Application Publication No. 2009-14566

SUMMARY OF THE INVENTION

Problem that the Invention is to Solve

In recent years, progress has been made in development and tentative introduction of large-scale battery systems used for energy storage purposes. As the range of applications of the battery systems widens, the battery systems have been demanded to have extendability to flexibly cope with various requests on voltage and current capacity.

A measure to realize such extendability may be to establish connection mode(s) between a plurality of battery elements in accordance with predetermined voltage and current capacity. To establish such a battery system, it is important to grasp and manage the connection mode(s) between the plurality of battery elements. However, this is infeasible with the battery system of Patent Document 1.

The present invention has been made in view of the above situation, and it is an object of the present invention to provide a battery system that enables grasp and management of connection mode(s) between a plurality of battery elements.

Means for Solving the Problem

It is an object of the present invention to provide a b battery system comprising a plurality of battery elements connected to each other in either one or both of a series connection mode and a parallel connection mode, the battery system further comprising: an identifying information setting section for setting identifying information on each of the plurality of battery elements; and a connection mode managing section for managing a connection mode between the plurality of battery elements by using the identifying information set by the identifying information setting section, the identifying information on each of the plurality of battery elements comprising a combination of first identifying information on a potential of the battery element and second identifying information on a superordinate battery element to which the battery element belongs.

Effect of the Invention

The battery system according to embodiments of the present invention enables grasp and management of connection mode(s) between a plurality of battery elements.

MODES FOR CARRYING OUT THE INVENTION

In the following paragraphs, detailed descriptions will be made of battery systems according to embodiments of the present invention with reference to the drawings.

[Summary of Battery Module 11]

Figure 1:
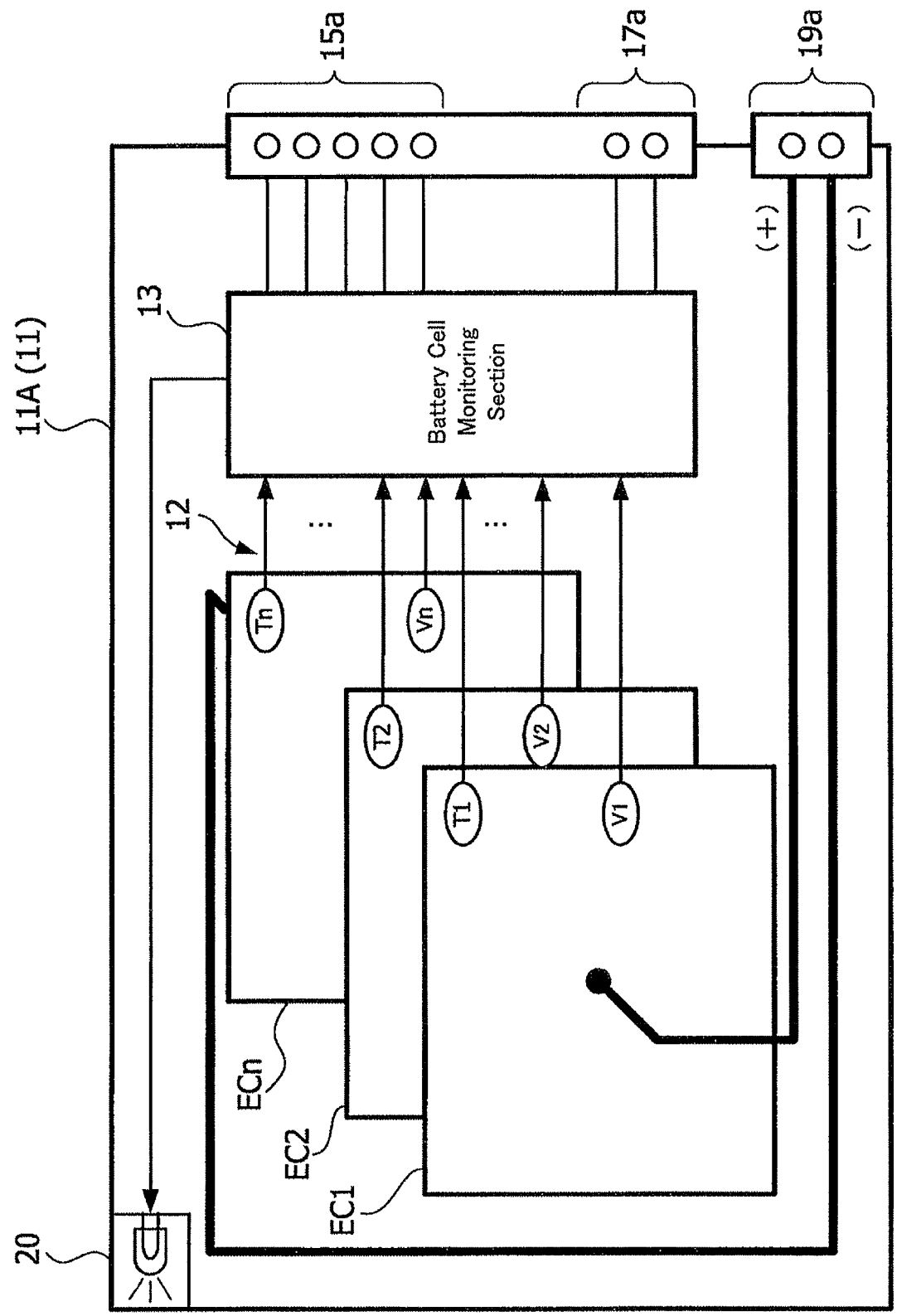
FIG. 1 A schematic functional block diagram of a battery module, which is a component of a battery system according to an embodiment of the present invention.

First, a description will be made of a battery module 11, which is a component of a battery system according to an embodiment of the present invention with reference to FIG. 1. FIG. 1 is a schematic functional block diagram of the battery module 11.

In the following description, each of battery modules is denoted by the "11A", "11B", "11C" . . . as a combination of the main Reference "11" assigned to the battery modules and the branch Reference "A", "B", "C" . . . , to follow thereafter. The battery module, when mentioned in general, is denoted by the main Reference "11" alone. Such a system of notation is applied to serial communication interfaces (SCI) 17, power source circuit terminal sections 19, battery packs 21, identifying information signal terminal sections 23 to be described later, as well as the battery modules.

As shown in FIG. 1, a battery module 11A, which is equivalent to one of the "battery elements" according to the present invention, includes a DC power source circuit 12, a battery cell monitoring section 13, an identifying information signal terminal section 15a, a serial communication interface (SCI: Serial Communication Interface; hereinafter abbreviated as the "SCI") 17a, a power source circuit terminal section (hereinafter referred to as the "power") 19a and a display 20.

The DC power source circuit 12 includes a plurality of battery cells (for example, lithium ion secondary batteries) EC1, EC2, ..., ECn (where n is a natural number) connected in series. The DC power source circuit 12 has a positive terminal and a negative terminal connected to the power source circuit terminal section 19a for feeding to the outside direct-current power charged in the plurality of battery cells EC1, EC2, ..., ECn. The plurality of battery cells EC1, EC2, ..., ECn have respectively temperature sensors T1, T2, T3, ..., Tn for detecting the temperatures around the battery cells and voltage sensors V1, V2, V3, ..., Vn for detecting the voltages of the battery cells.

The battery cell monitoring section 13 has the function of managing the plurality of battery cells EC1, EC2, ..., ECn. More specifically, the battery cell monitoring section 13 acquires values of the temperatures from the respective temperature sensors T1, T2, T3, ..., Tn and values of the voltages from the respective cell voltage sensors V1, V2, V3, ..., Vn and makes temperature correction to determine the state of charge (SOC) of each of the battery cells EC1, EC2, ..., ECn. Further, the battery cell monitoring section 13 determines whether the battery cells EC1, EC2, ..., ECn are overcharged or overdischarged based on the voltages thereof.

The identifying information signal terminal section 15a allows passage of a signal indicative of identifying information for uniquely identifying a battery module 11 which is equivalent to the "battery element" according to the present invention. The SCI 17a allows passage of a signal for information communication between the battery module 11 and a battery pack 21 which is equivalent to the "superordinate battery element" according to the present invention to which the battery module 11 belongs. The information for the communication between the battery module 11 and the battery pack 21 includes information indicative of values of the temperature and voltage and information indicative of the state of charge (SOC) of each of the battery cells EC1, EC2, ..., ECn.

The power source circuit terminal section 19a allows passage of power; the direct-current power charged in the battery cells EC1, EC2, ..., ECn is fed to the outside through the power source circuit terminal section 19a while power is supplied from the outside through the power source circuit terminal section 19a to be accumulated in the plurality of battery cells EC1, EC2, ..., ECn. The display 20 has the function of displaying the state of operation of the battery module 11A.

The battery module 11A configured as described above has a capacity of, but not limited to, for example, about 10 Ah to 30 Ah. The battery module 11A has, upon necessity, the functions of operations on the internal impedance and the state of health (SOH) of each of the battery cells EC1, EC2, ..., ECn health, the function of controlling balance between the voltages of the battery cells, and the function of detecting leakage of current inside the battery module 11A, as well as the function of an SOC operation.

[Summary of Battery Pack 21]

Figure 2:
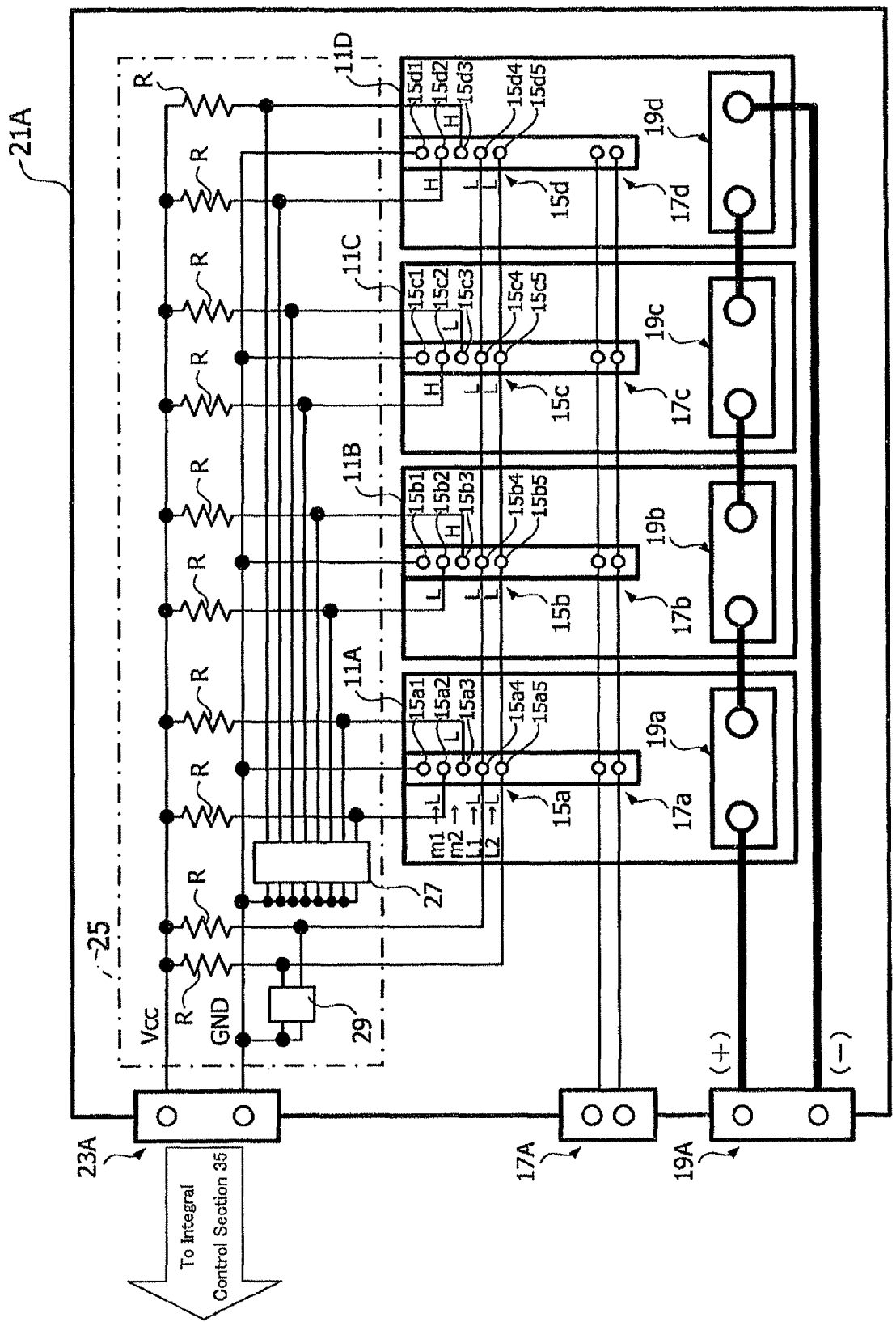
FIG. 2 A schematic functional block diagram of a battery pack, which is a component of the battery system according to an embodiment of the present invention.

Now, a description will be made of the battery pack 21 which is equivalent to the battery system according to an embodiment of the present invention with reference to FIG. 2. FIG. 2 is a schematic functional block diagram of the battery pack 21.

As shown in FIG. 2, the battery pack 21A which is equivalent to one of the "battery elements" according to the present invention includes four battery modules 11A-11D, a SCI 17A, a power source circuit terminal section 19A, an identifying information signal terminal section 23A, and an identifying information setting section 25.

As shown in FIG. 2, the SCI 17A is connected to SCIs 17a-17d of the respective four battery modules 11A-11D. The SCI 17A allows passage of a signal for communication between the battery pack 21A and a battery system 31. The battery system 31 is equivalent to the "superordinate battery element" of which the battery pack 21A is a component.

It should be noted that a communication path of a star type, a bus type, or the like type may be adopted properly to connect the SCIs 17a-17d.

As shown in FIG. 2, the power source circuit terminal section 19A is connected to the positive terminals and the negative terminals of power source circuit terminal sections 19a-19d of the respective four battery modules 11A-11D. The power source circuit terminal section 19A allows passage of power; the direct-current power charged in the plurality of battery modules 11A-11D is fed to the outside through the power source circuit terminal section 19A while power is supplied from the outside through the power source circuit terminal section 19A to be accumulated in the plurality of battery modules 11A-11D.

As shown in FIG. 2, the identifying information signal terminal section 23A allows passage, into an integral control section 35, of a signal indicative of identifying information for uniquely identifying each of the battery modules 11A-11D of the battery pack 21A.

It should be noted that the SCI 17A, the power source circuit terminal section 19A and the identifying information signal terminal section 23A are preferably spaced apart from each other to reduce effects of noises.

The identifying information setting section 25 has the function of creating the signal indicative of the identifying information for uniquely identifying each of the battery modules 11A-11D of the battery pack 21A. More specifically, as shown in FIG. 2, the identifying information setting section 25 includes a positive bus Vcc, a negative bus GND, a plurality of pull-up resistors R, and a first address setting section 27 and a second address setting section 29.

Power for setting the identifying information to each of the battery modules 11A-11D may be supplied from the outside via the identifying information signal terminal section 23A, as shown in FIG. 2. Alternatively, the power accumulated in the battery modules 11A-11D may be used.

The first address setting section 27 and the second address setting section 29 may be, for example, a DIP switch, a short pin, or the like. With this configuration, the identifying information (address) assigned to each of the battery modules 11A-11D can be set to any value. In the case where there is no need to change the value of the address, the first address setting section 27 and the second address setting section 29 may be any circuits that allow fixed values to be set for the "H" and the "L", respectively.

The battery modules 11A-11D have respective identifying information signal terminal sections 15a-15d with first terminals 15a1-15d1 thereof connected to the negative bus GND. The identifying information signal terminal sections 15a-15d have second terminals 15a2-15d2 and third terminals 15a3-15d3 connected to the positive bus Vcc via pull-up resistors R. The second terminals 15a2-15d2 and the third terminals 15a3-15d3 are connected to the negative bus GND via the first address setting section 27.

The identifying information signal terminal sections 15a-15d have fourth terminals 15a4-15d4 and fifth terminals 15a5-15d5 connected to the positive bus Vcc via the pull-up resistors R. The fourth terminals 15a4-15d4 and the fifth terminals 15a5-15d5 are connected to the negative bus GND via the second address setting section 29.

Here, a schematic description will be made of the identifying information assigned to each of the battery modules 11A-11D with reference to FIG. 2. As shown in FIG. 2, it is assumed that the battery pack (equivalent to the "battery system" according to the present invention) 21A includes the four battery modules 11A-11D connected in series. In this case, for example, the 2-bit address values "00", "01", "10" and "11" are assigned to first identifying information m1m2 on the potentials of the respective battery modules 11A-11D.

Further, the 2-bit address value "00" is assigned to second identifying information n1n2 on the superordinate battery element (battery pack 21A) to which the battery modules 11A-11D belong. It is the main feature of the present invention that the identifying information on each of the battery modules 11A-11D is made up of a combination of the first identifying information m1m2 on the potential of the one of the battery modules 11A-11D and the second identifying information n1n2 on the superordinate battery element to which the one of the battery modules 11A-11D belongs. This will be detailed later.

[Summary of the Battery Block Accommodating Unit 31]

Figure 3A:
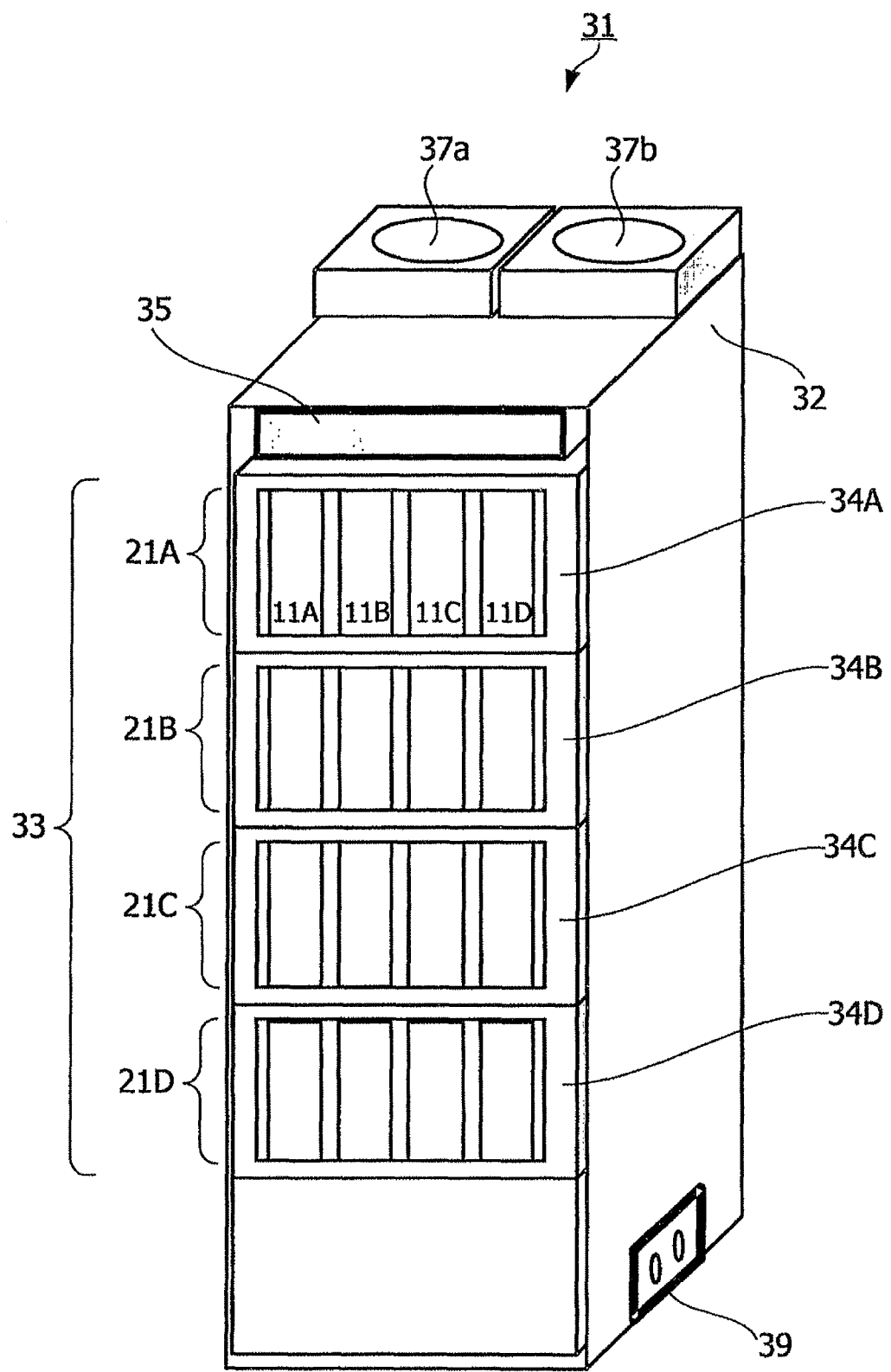
FIG. 3A An external view of the battery block accommodating unit for accommodating and storing the battery system according to an embodiment of the present invention.
Figure 3B:
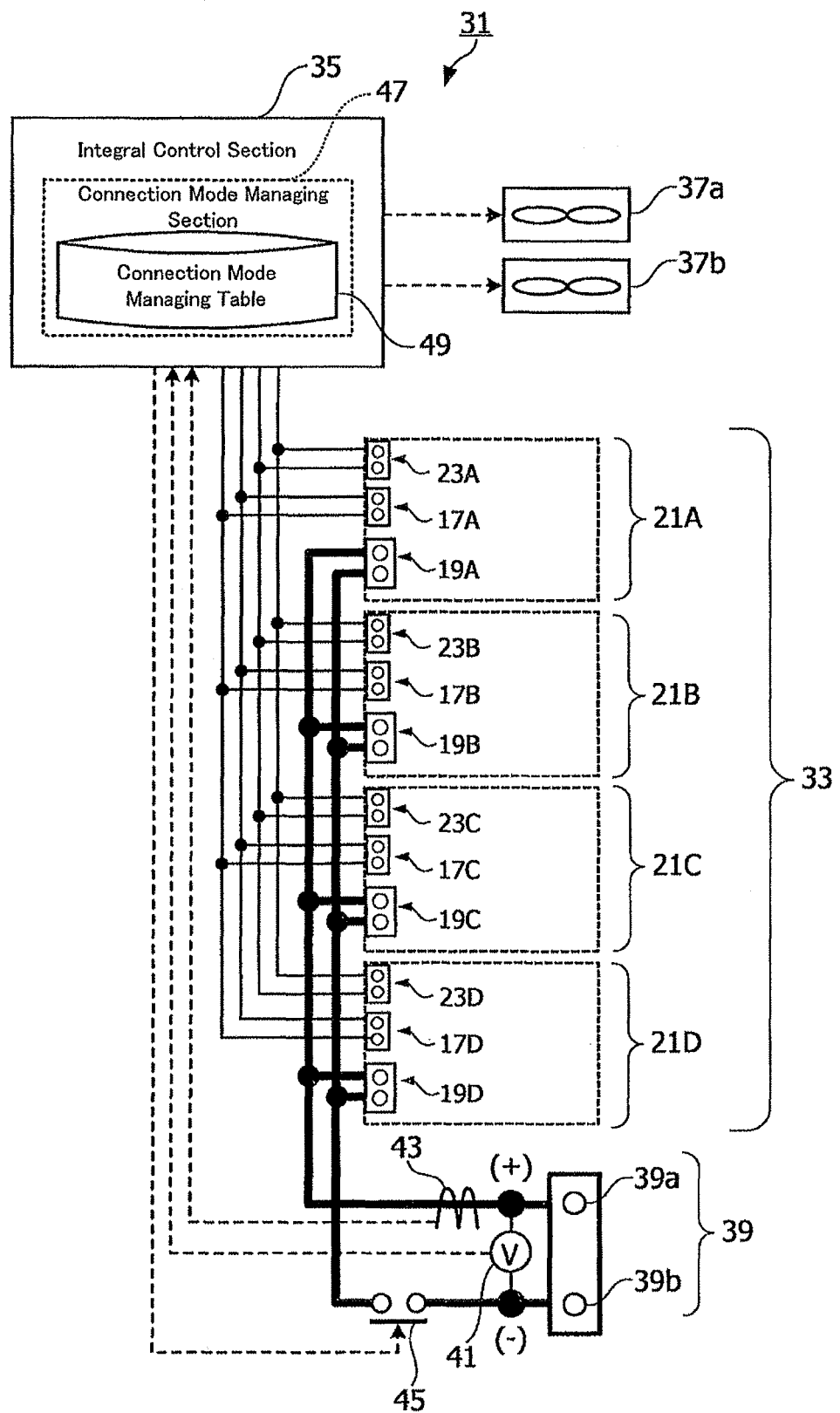
FIG. 3B A schematic functional block diagram of the internal configuration of the battery block accommodating unit.

A description will be made of a battery system for accommodating and storing the battery block accommodating unit 31 according to an embodiment of the present invention with reference to FIGS. 3A and 3B. FIG. 3A is an external view of the battery block accommodating unit 31. FIG. 3B is a schematic functional block diagram of the internal configuration of the battery block accommodating unit 31.

As shown in FIGS. 3A and 3B, the battery block accommodating unit 31 includes a battery block 33, the integral control section 35, a pair of fans 37a and 37b, a main power source terminal section 39, and a cabinet 32 for mounting these components. As shown in FIG. 3A, the battery block 33 includes four battery packs 21A-21D stacked on one another in the cabinet 32.

It should be noted that as shown in FIG. 3A, the battery packs 21A-21D are accommodated in rectangular parallelepiped cases 34A-34D, respectively. The battery modules 11A-11D, which are rectangular parallelepiped, are configured to be slidingly moved from one side of the case 34A along a longitudinal direction thereof so as to be mounted in places, respectively. With this configuration, connector members, not shown, of the case 34A and connector members of the battery modules 11A-11D are allowed to fit together for electrically connecting the battery modules 11A-11D and battery pack 21A when the battery modules 11A-11D are respectively mounted in places relative to the case 34 A.

As shown in FIG. 3B, the battery block 33 has the four battery packs 21A-21D connected in parallel by power source circuit terminal sections (powers) 19A-19D thereof connected to a positive terminal 39a and a negative terminal 39b of the main power source terminal section 39. A voltage sensor 41 for detecting a DC voltage of a main power source is disposed between a positive bus connected to the positive terminal 39a and a negative bus connected to the negative terminal 39b. Further, a current sensor 43 is disposed on the positive bus connected to the positive terminal 39a for detecting a value of current flowing through that positive bus. Further, an opening and closing switch 45 is disposed on the negative bus connected to the negative terminal 39b.

The voltage sensor 41, the current sensor 43 and a movable contact of the opening and closing switch 45 are connected to the integral control section 35. Further, the SCIs 17A-17D and the identifying information signal terminal sections 23A-23D of the respective battery packs 21A-21D are connected to the integral control section 35. Moreover, the pair of fans 37a and 37b are connected to the integral control section 35.

It should be noted that a communication path of a star type, a bus type, or the like type may be adopted properly to connect the SCIs 17A-17D, and the respective SCIs 17A-17D and the integral control section 35.

As shown in FIG. 3B, the integral control section 35 is configured to include a connection mode managing section 47. As shown in FIG. 3B, in order to manage connection modes between the battery modules 11A-11D serving as the "battery elements" and between the battery packs 21A-21D, the connection mode managing section 47 is configured to include a connection mode managing table 49. The contents of the connection mode managing table 49 will be described later.

[Details of the Identifying Information Assigned to each of the Battery Modules 11A-11D]

Figure 4A:
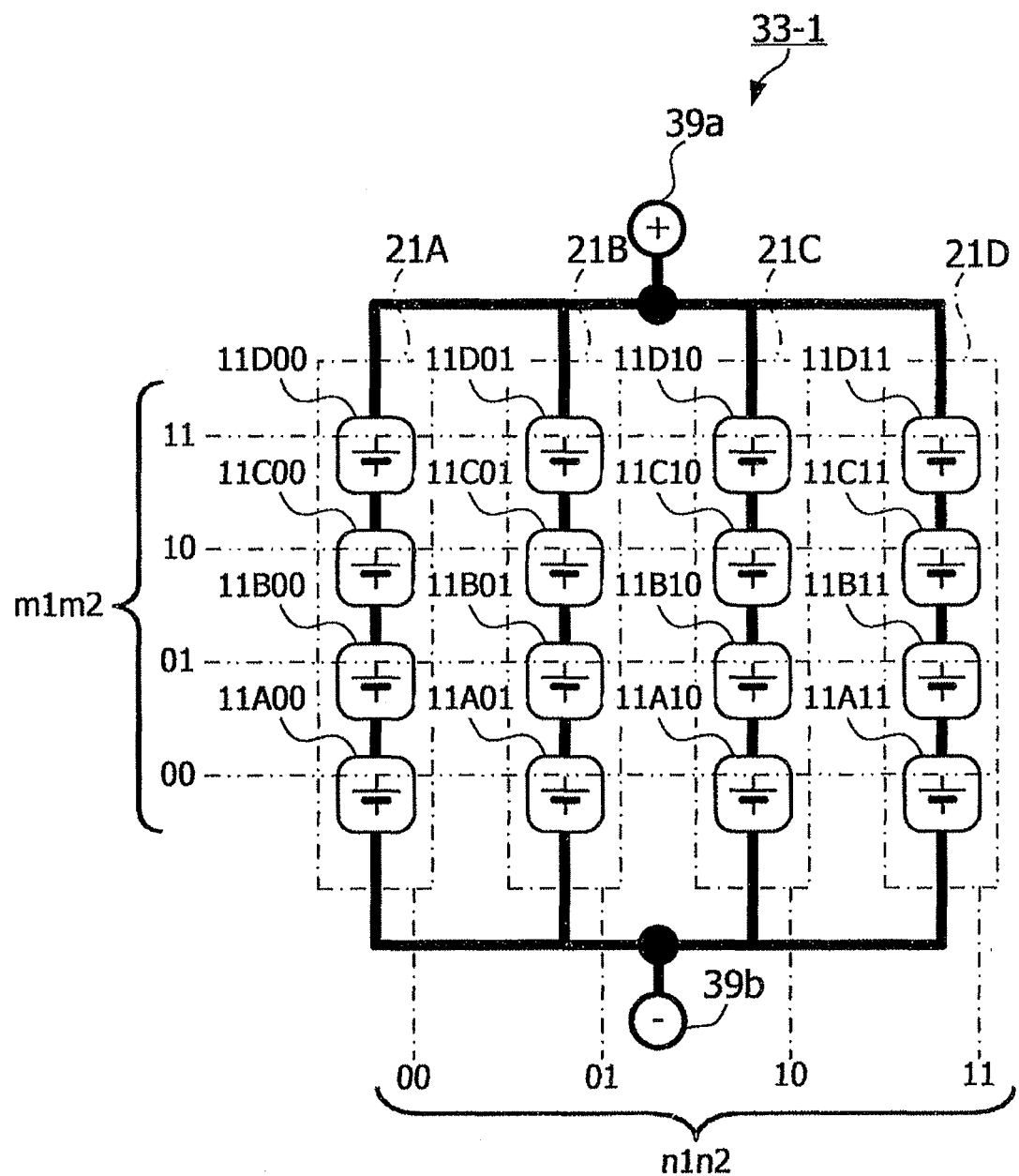
FIG. 4A A conceptual diagram showing the details of the identifying information on the battery modules (parallel connection).
Figure 4B:
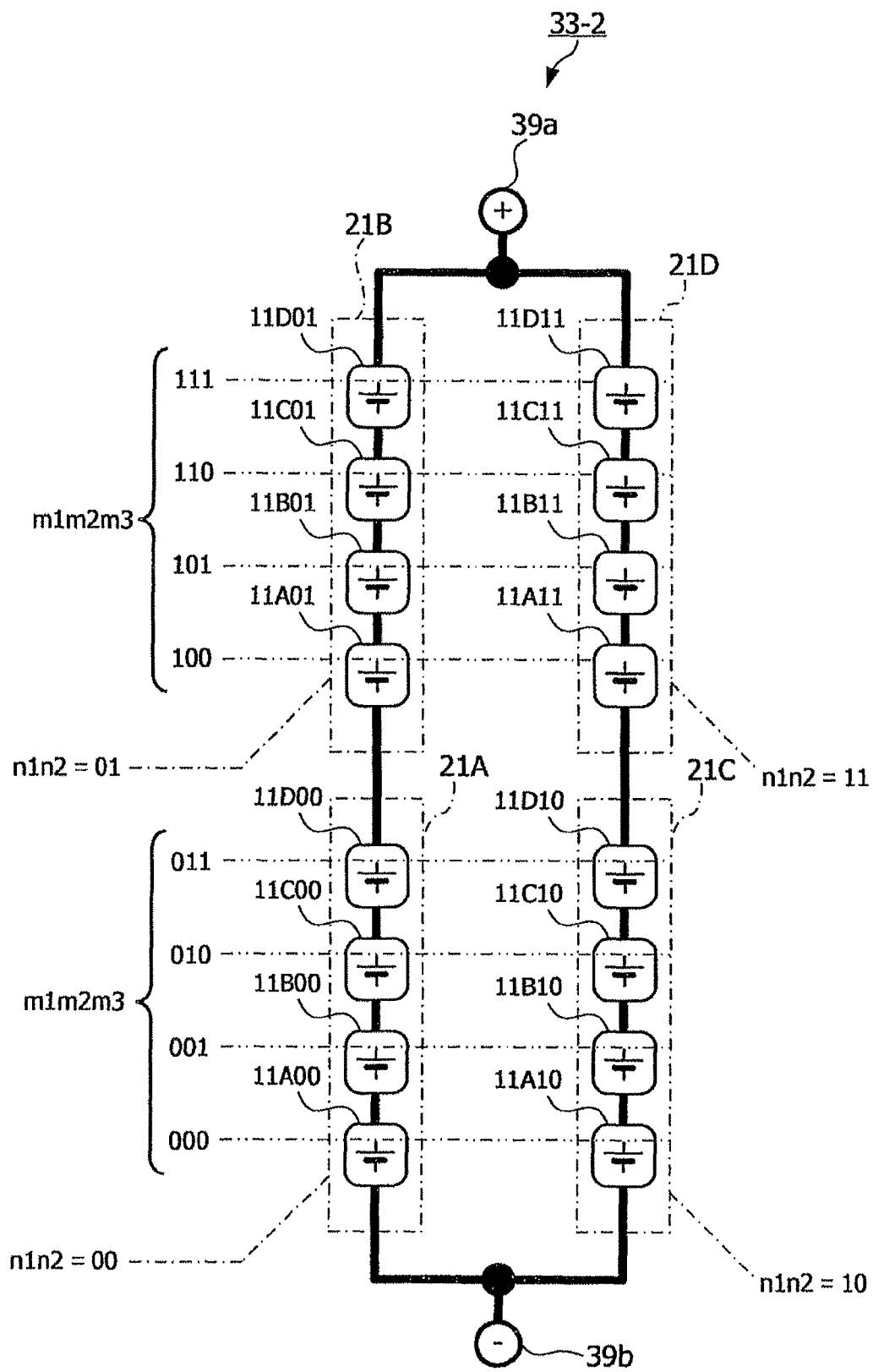
FIG. 4B A conceptual diagram showing the details of the identifying information on the battery modules (series parallel connection).

Now, a detailed description will be made of the identifying information on each of the battery modules 11A-11D with reference to FIGS. 4A and 4B. FIG. 4A is a conceptual diagram showing the details of the identifying information on the battery modules 11A-11D in the battery block 33 that is composed of the four battery packs 21A-21D connected in parallel. FIG. 4B is a conceptual diagram showing the details of the identifying information on the battery modules 11A-11D in the battery block 33 that is composed of a pair of assembled batteries connected in parallel, each assembled battery composed of two of the battery packs 21A-21D connected in series.

First Embodiment

According to First Embodiment shown in FIG. 4A, a battery block 33-1 is composed of the four battery packs 21A-21D connected in parallel between the positive terminal 39a and the negative terminal 39b.

In the following description, for explaining battery modules in battery packs connected in parallel, each battery pack serving as an assembled battery composed of a plurality of battery modules connected in series, each battery module is denoted by the "11A00", "11B00", "11C00" . . . as a combination of the main Reference "11A", "11B", "11C", "11D" . . . assigned to the battery module of each assembled battery and branch Reference "00", "01", "10", "11" to follow thereafter. The battery module, when mentioned in general, is denoted by the main Reference"11A", "11B", "11C", "11D" . . . .

The same value "00" is assigned to the first identifying information m1m2 on battery modules 11A00-11A11, of the battery modules 11A-11D serving as the "battery elements", having the same first potential "00" (See a row direction relating to the "00" in FIG. 4A). Likewise, the same value "01" is assigned to the first identifying information m1m2 on battery modules 11B00-11B11 having the same second potential "01" (See the row direction relating to the "01" in FIG. 4A). The same value "10" is assigned to the first identifying information m1m2 on battery modules 11C00-11C11 having the same third potential "10" (See the row direction relating to the "10" in FIG. 4A). The same value "11" is assigned to the first identifying information m1m2 on battery modules 11D00-11D11 having the same fourth potential "11" (See the row direction relating to the "11" in FIG. 4A).

On the other hand, the battery modules 11A00-11D00, of the battery modules 11A-11D serving as the "battery elements", aligned in a column direction relating to the "00" in FIG. 4A belong to the same battery pack 21A which serves as the "superordinate battery element". Likewise, the battery modules 11A01-11D01 aligned in the column direction relating to the "01" in FIG. 4A belong to the same battery pack 21B which serves as the "superordinate battery element". Likewise, the battery modules 11A10-11D10 aligned in the column direction relating to the "10" in FIG. 4A belong to the same battery pack 21C which serves as the "superordinate battery element". Likewise, the battery modules 11A11-11D11 aligned in the column direction relating to the "11" in FIG. 4A belong to the same battery pack 21D which serves as the "superordinate battery element".

In other words, the same value ("00", "01", "10" and "11") is assigned to the second identifying information n1n2 on the battery modules 11A-11D aligned in the column direction.

Here, different values are assigned to the second identifying information n1n2 on battery modules that belong to different superordinate battery elements (battery packs).

Table 1 shows the content of the connection mode managing table 49 (See FIG. 3B) of the connection mode managing section 47 of the battery system according to First Embodiment. As shown in Table 1, the identifying information on each of the battery modules 11A-11D according to First Embodiment is made up of a combination of a value assigned to the first identifying information m1m2 (2 bits) on the potential level of the battery module out of the four potential levels of the respective battery modules 11A-11D and a value assigned to the second identifying information n1n2 (2 bits) on the superordinate battery element to which the battery module belongs.

TABLE 1

Connection Mode Managing Table

| m1m2 | n1n2 | m1m2 | n1n2 | m1m2 | n1n2 | m1m2 | n1n2 |
|------|------|------|------|------|------|------|------|
| 11 | 00 | 11 | 01 | 11 | 10 | 11 | 11 |
| 10 | 00 | 10 | 01 | 10 | 10 | 10 | 11 |
| 01 | 00 | 01 | 01 | 01 | 10 | 01 | 11 |
| 00 | 00 | 00 | 01 | 00 | 10 | 00 | 11 |

According to the battery system of First Embodiment, the connection mode(s) between the battery modules 11A-11D (the serial connection or parallel connection, and arrangement order of the battery modules) can be uniquely grasped and managed based on the identifying information made up of the combination of a value of the first identifying information m1m2 (2 bits) on the potential level of the battery module out of the four potential levels of the respective battery modules 11A-11D and a value of the second identifying information n1n2 (2 bits) on the superordinate battery element to which the battery module belongs.

More specifically, for determining whether the connection mode between the battery modules 11 is a serial connection or a parallel connection, the first identifying information m1m2 and the second identifying information n1n2 assigned to each of the battery modules 11 is referred to.

When the same value is assigned to the first identifying information m1m2 on the battery modules 11 while different values are assigned to the second identifying information n1n2 thereon, it is determined that the connection mode between the battery modules 11 is the parallel connection.

On the other hand, when different values are assigned to the first identifying information m1m2 on the battery modules 11 while the same value is assigned to the second identifying information n1n2 thereon, it is determined that the connection mode between the battery modules 11 is the serial connection.

Further, for determining the arrangement order of the battery modules 11 when the connection mode between the battery modules 11 is the serial connection, values assigned to the first identifying information m1m2 on the respective battery modules 11 are referred to in order to determine size relation of those values. It is assumed that the potential levels are arranged in ascending order (the values "00", "01", "10" and "11" are assigned to a lower potential, an lower intermediate potential, an upper intermediate potential, and a higher potential, respectively when the first identifying information is made up of, for example, two bits).

In this case, it is determined that a battery module with a greater value assigned to the first identifying information m1m2 thereon is positioned higher (has a higher potential) than a battery module with a smaller value assigned to the first identifying information m1m2 thereon. This procedure for determination is applied to Second Embodiment to Fifth Embodiment as well.

In the battery system according to First Embodiment, it is assumed that a serial communication between the SCIs 17a-17d of the respective battery modules 11A-11D using a same communication bus is conducted by sending a communication frame specifying a destination and a source using the identifying information of First Embodiment. In this case, the information communication between the battery modules 11A-11D is made with the first and second identifying information on the destination and the source uniquely specified. Therefore, the battery system according to First Embodiment enables smooth information communication between the battery modules 11A-11D without causing confusions.

Second Embodiment

According to Second Embodiment shown in FIG. 4B, a battery block 33-2 is composed of a pair of assembled batteries connected in parallel between the positive terminal 39a and the negative terminal 39b. The two assembled batteries are composed of two pairs of battery packs (a pair of battery packs 21A and 21B) (a pair of battery packs 21C and 21D), respectively. Each pair of battery packs are connected in series.

It should be noted that the above connection mode between the battery packs 21A-21D that compose the battery block 33-2 according to Second Embodiment, that is, the connection mode between the battery packs 21A-21D connected in parallel, each of the battery packs 21A-21D composed of battery modules connected in series, is referred to in some cases as the "series parallel connection mode".

The same value "000" is assigned to first identifying information m1m2m3 on the battery modules 11A00, 11A10, of the battery modules 11A-11D serving as the "battery elements", having the same first potential "000" (See a row direction relating to the "000" in FIG. 4B). Likewise, the same value "001" is assigned to the first identifying information m1m2m3 on the battery modules 11B00, 11B10 having the same second potential "001" (See the row direction relating to the "001" in FIG. 4B). The same value "010" is assigned to the first identifying information m1m2m3 on the battery modules 11C00, 11C10 having the same third potential "010" (See the row direction relating to the "010" in FIG. 4B). The same value "011" is assigned to the first identifying information m1m2m3 on the battery modules 11D00, 11D10 having the same fourth potential "011" (See the row direction relating to the "011" in FIG. 4B).

Further, the same value "100" is assigned to the first identifying information m1m2m3 on the battery modules 11A01, 11A11, of the battery modules 11A-11D serving as the "battery elements", having the same fifth potential "100" (See the row direction relating to the "100" in FIG. 4B). Likewise, the same value "101" is assigned to the first identifying information m1m2m3 on the battery modules 11B01, 11B11 having the same sixth potential "101" (See the row direction relating to the "101" in FIG. 4B). The same value "110" is assigned to the first identifying information m1m2m3 on the battery modules 11C01, 11C11 having the same seventh potential "110" (See the row direction relating to the "110" in FIG. 4B). The same value "111" is assigned to the first identifying information m1m2m3 on the battery modules 11D01, 11D11 having the same eighth potential "111" (See the row direction relating to the "111" in FIG. 4B).

On the other hand, the battery modules 11A00-11D00, of the battery modules 11A-11D serving as the "battery elements", aligned in a column direction relating to the "00" in FIG. 4B belong to the same battery pack 21A which serves as the "superordinate battery element". Likewise, the battery modules 11A01-11D01 aligned in the column direction relating to the "01" in FIG. 4B belong to the same battery pack 21B which serves as the "superordinate battery element". Likewise, the battery modules 11A10-11D10 aligned in the column direction relating to the "10" in FIG. 4B belong to the same battery pack 21C which serves as the "superordinate battery element". Likewise, the battery modules 11A11-11D11 aligned in the column direction relating to the "11" in FIG. 4B belong to the same battery pack 21D which serves as the "superordinate battery element".

In other words, the same value ("00", "01", "10" and "11") is assigned to the second identifying information n1n2 on the battery modules 11A-11D aligned in the column direction.

Table 2 shows the content of the connection mode managing table 49 (See FIG. 3B) according to Second Embodiment. As shown in Table 2, the identifying information on each of the battery modules 11A-11D according to Second Embodiment is made up of a combination of a value assigned to the first identifying information m1m2m3 (3 bits) on the potential level of the battery module out of the eight potential levels of the battery modules 11A-11D and a value assigned to the second identifying information n1n2 (2 bits) on the superordinate battery element to which the battery module belongs.

TABLE 2

| Connection Mode Managing Table | | | |
| --- | --- | --- | --- |
| m1m2m3 | n1n2 | m1m2m3 | n1n2 |
| 111 | 01 | 111 | 11 |
| 110 | 01 | 110 | 11 |
| 101 | 01 | 101 | 11 |
| 100 | 01 | 100 | 11 |
| 011 | 00 | 011 | 10 |
| 010 | 00 | 010 | 10 |
| 001 | 00 | 001 | 10 |
| 000 | 00 | 000 | 10 |

According to the battery system of Second Embodiment, the connection mode(s) between the battery modules 11A-11D (the serial connection or parallel connection, and arrangement order of the battery modules) can be uniquely grasped and managed based on the identifying information made up of the combination of a value assigned to the first identifying information m1m2m3 (3 bits) on the potential level of the battery module out of the eight potential levels of the battery modules 11A-11D and a value assigned to the second identifying information n1n2 (2 bits) on the superordinate battery element to which the battery module belongs.

In the battery system according to Second Embodiment, it is assumed that a serial communication between the SCIs 17a-17d of the respective battery modules 11A-11D using a same communication bus is conducted by sending a communication frame specifying a destination and a source using the identifying information of First Embodiment. In this case, the information communication between the battery modules 11A-11D is made with the first and second identifying information on the destination and the source uniquely specified. Therefore, like the battery system of First Embodiment, the battery system according to Second Embodiment enables smooth information communication between the battery modules 11A-11D without causing confusions.

[Procedures for Grasping Connection Mode between Pair of Battery Packs 21A and 21B]

Figure 5A:
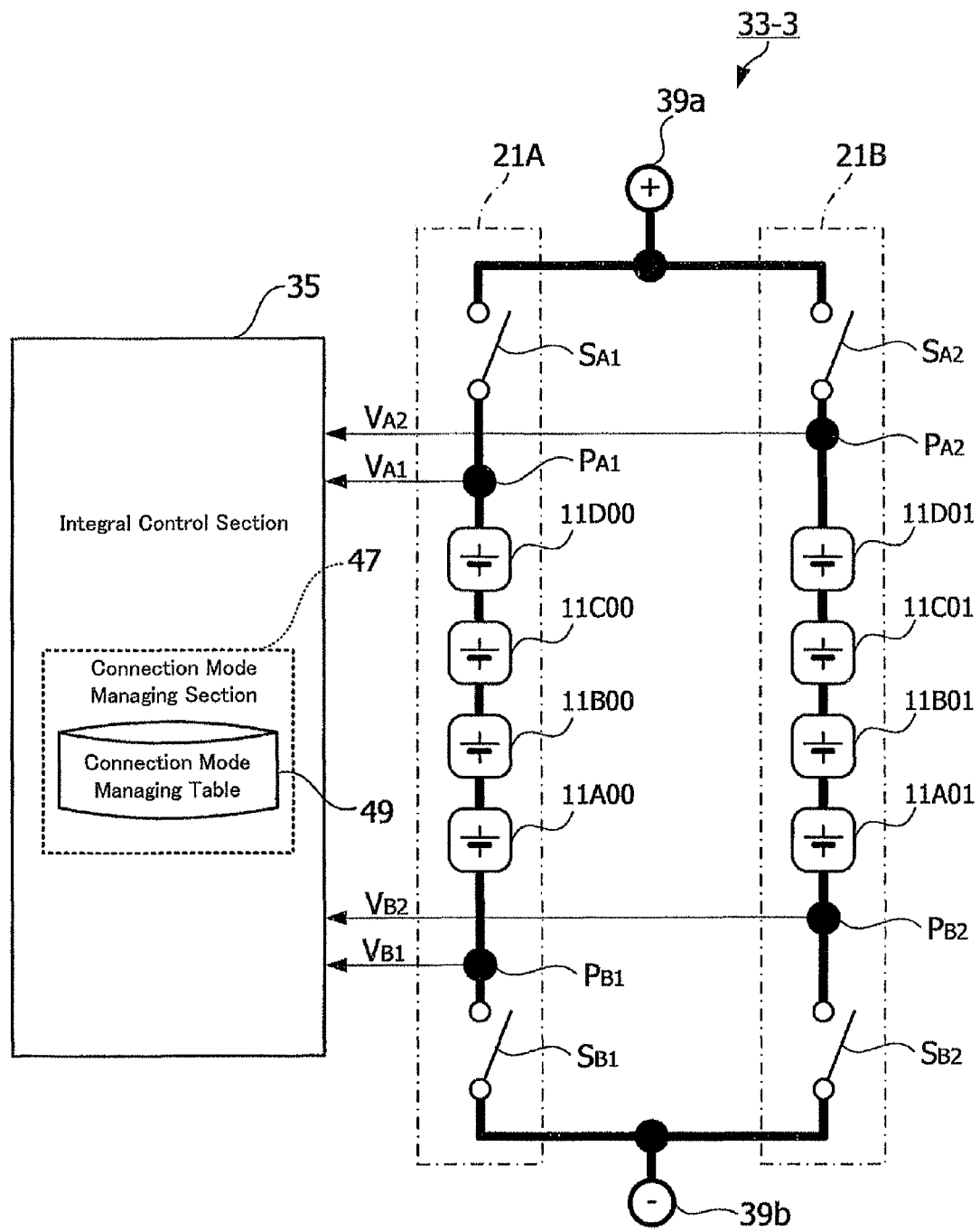
FIG. 5A A schematic view showing a procedure for grasping the connection mode between the pair of battery packs connected in parallel that compose the battery block.
Figure 5B:
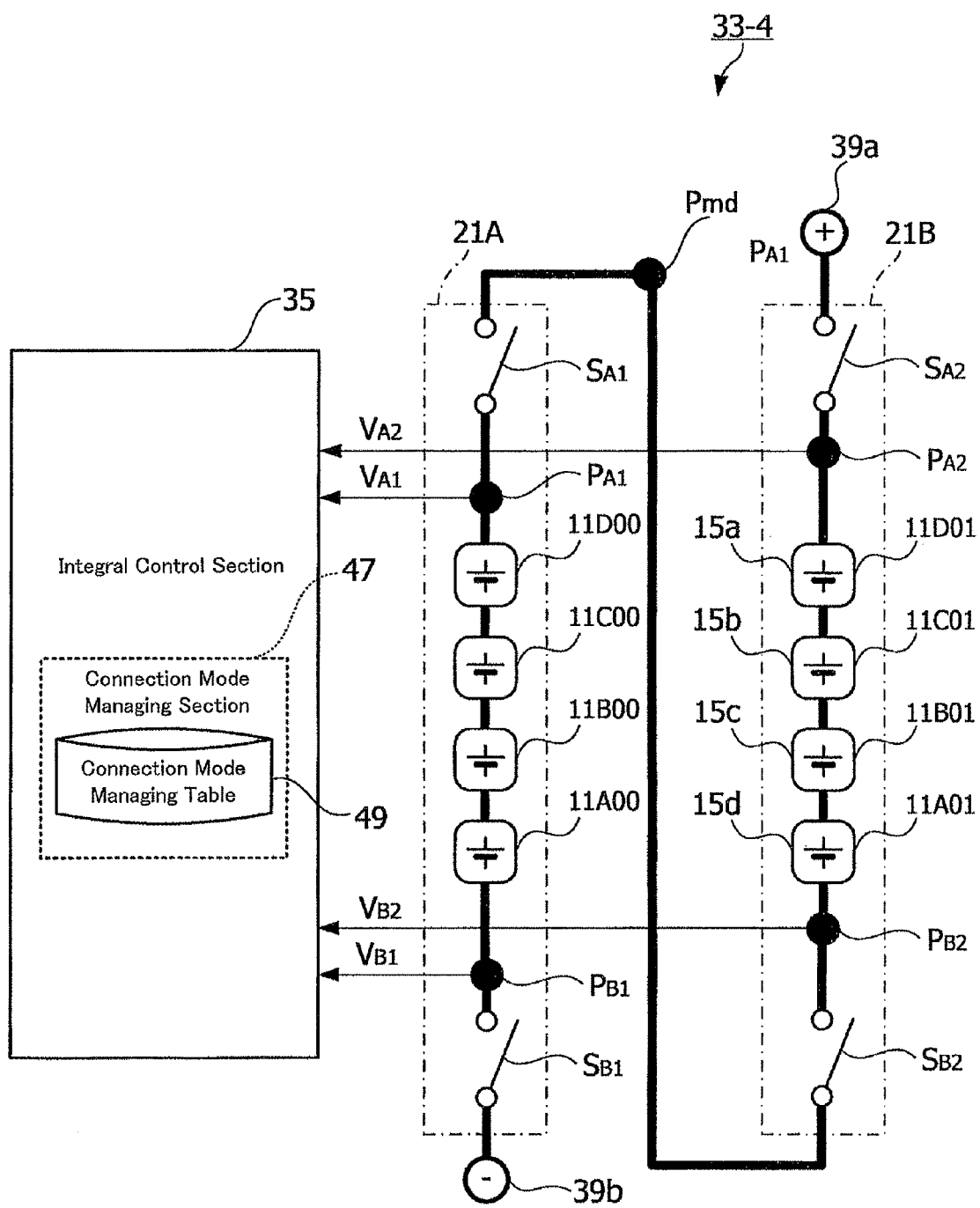
FIG. 5B A schematic view showing a procedure for grasping the connection mode between the pair of battery packs connected in series that compose the battery block.
Figure 5C:
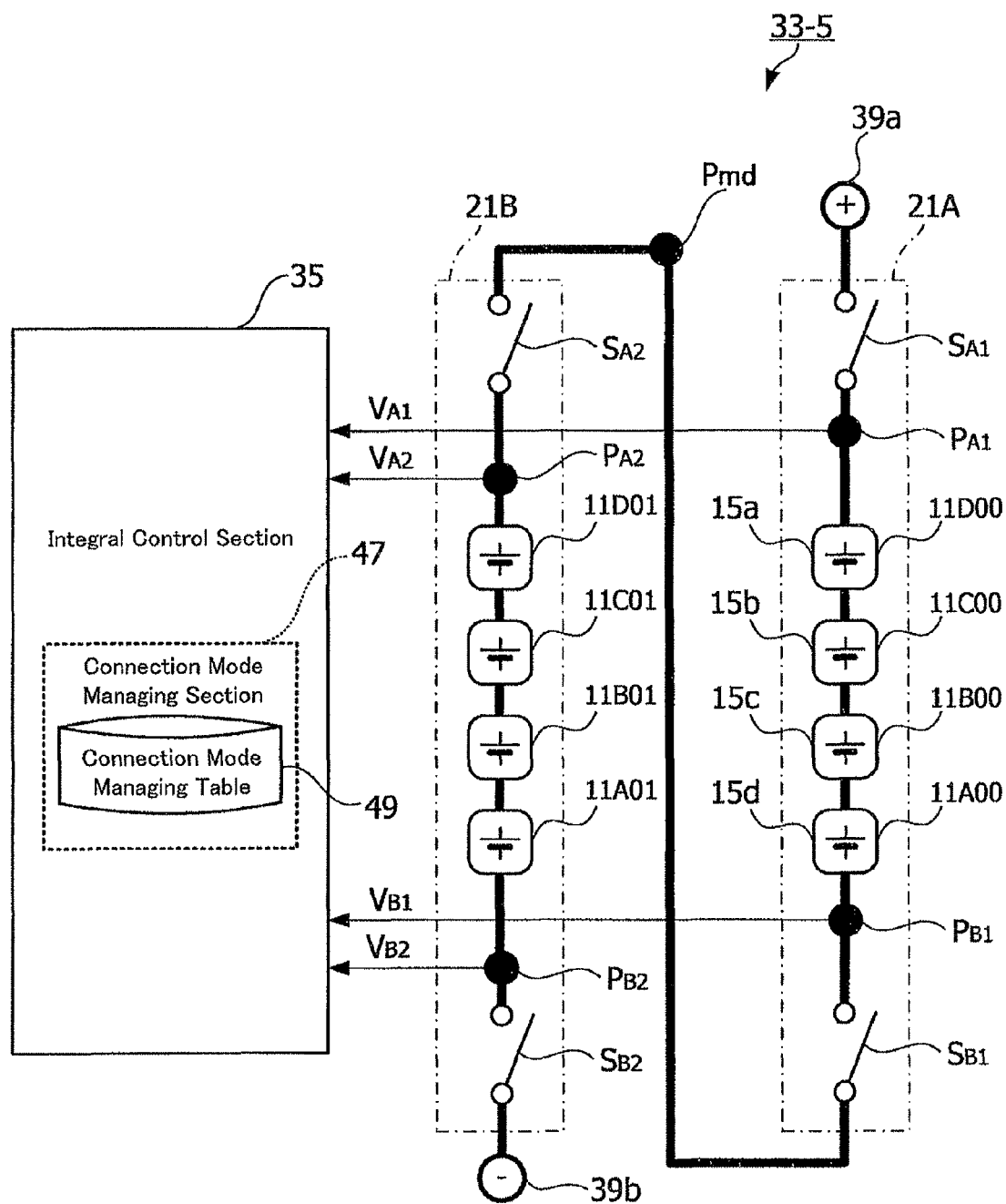
FIG. 5C A schematic view showing a procedure for grasping the connection mode between the pair of battery packs connected in series that compose the battery block, the arrangement order of the pair of battery packs being reversed from that in FIG. 5B.

Now, a description will be made of procedures for grasping the connection mode between the pair of battery packs 21A and 21B with reference to FIGS. 5A-5C. FIG. 5A is a schematic view showing a procedure for grasping the connection mode between the pair of battery packs 21A and 21B connected in parallel that compose the battery block 33. FIG. 5B is a schematic view showing a procedure for grasping the connection mode between the pair of battery packs 21A and 21B connected in series that compose the battery block 33. FIG. 5C is a schematic view showing a procedure for grasping the connection mode between the pair of battery packs 21A and 21B connected in series that compose the battery block 33. In FIG. 5C, the arrangement order of the pair of battery packs 21A and 21B is reversed from that in FIG. 5B.

Third Embodiment

According to Third Embodiment shown in 5A, a battery block 33-3 is composed of a pair of a first battery pack 21A and a second battery pack 21B connected in parallel between the positive terminal 39a and the negative terminal 39b.

The first battery pack 21A includes an A1 switch $S_{A1}$, an A1 connection point $P_{A1}$, the four battery modules 11A00-11D00, a B1 connection point $P_{B1}$ and a B1 switch $S_{B1}$ connected in this order between the positive terminal 39a and the negative terminal 39b. The A1 connection points $P_{A1}$ and $P_{B1}$ have respective potentials $V_{A1}$ and $V_{B1}$, which are monitored by the integral control section 35.

The second battery pack 21B includes an A2 switch $S_{A2}$, an A2 connection point $P_{A2}$, the four battery modules 11A01-11D01, a B1 connection point $P_{B2}$ and a B1 switch $S_{B2}$ connected in this order between the positive terminal 39a and the negative terminal 39b. The A2 connection points $P_{A2}$ and $P_{B2}$ have respective potentials $V_{A2}$ and $V_{B2}$, which are monitored by the integral control section 35.

It is assumed that the battery modules 11A00-11D00 of the first battery pack 21A have a capacity equal to that of the battery modules 11A01-11D01 of the second battery pack 21B.

It is assumed that the battery block 33-3 according to Third Embodiment has all the switches $S_{A1}$, $S_{B1}$, $S_{A2}$ and $S_{B2}$ closed and that, as shown in FIG. 5A, the battery block 33-3 is composed of the first battery pack 21A and the second battery pack 21B connected in parallel.

In this case, the potential $V_{A1}$ of the A1 connection point $P_{A1}$ and the potential $V_{A2}$ of the A2 connection point $P_{A2}$ are equal to each other, and the potential $V_{B1}$ of the B1 connection point $P_{B1}$ and the potential $V_{B2}$ of the B2 connection point $P_{B2}$ are equal to each other. Here, the former and the latter are referred to as Conditions 1 and 2, respectively.

Table 3 is the connection mode managing table 49 which shows how Conditions 1 and 2 correspond to the connection mode between the first battery pack 21A and the second battery pack 21B.

TABLE 3

| Condition 1 | Condition 2 | Connection Mode | Positioned Higher | Positioned Lower |
|---|---|---|---|---|
| $V_{A1} \approx V_{A2}$ | $V_{B1} \approx V_{B2}$ | Parallel Connection | — | — |

In short, the integral control section 35 monitors the potential $V_{A1}$ of the A1 connection point $P_{A1}$ and the potential $V_{B1}$ of the B1 connection point $P_{B1}$, and the potential $V_{A2}$ of the A2 connection point $P_{A2}$ and the potential $V_{B2}$ of the B2 connection point $P_{B2}$, and determines whether or not Conditions 1 and 2 are satisfied in order to grasp and manage whether or not the first battery pack 21A and the second battery pack 21B are connected in parallel.

Further, the integral control section 35 may modify the identifying information on the battery modules 11A00-11D00 of the first battery pack 21A and the identifying information on the battery modules 11A01-11D01 of the second battery pack 21B according to the connection mode(s) between the first battery pack 21A and the second battery pack 21B thus grasped and managed.

The battery system of Third Embodiment enables grasp and management of whether or not the first battery pack 21A and the second battery pack 21B are connected in parallel by a simple procedure of determining whether or not Conditions 1 and 2 are satisfied.

Fourth Embodiment

According to Fourth Embodiment shown in FIG. 5B, a battery block 33-4 is composed of the pair of the first battery pack 21A and the second battery pack 21B connected in series between the positive terminal 39a and the negative terminal 39b.

The first battery pack 21A includes the A1 switch $S_{A1}$, the A1 connection point $P_{A1}$, the four battery modules 11A00-11D00, the B1 connection point $P_{B1}$ and the B1 switch $S_{B1}$ connected in this order between a relay point $P_{md}$ and the negative terminal 39b. The potential $V_{A1}$ of the A1 connection point $P_{A1}$ and the potential $V_{B1}$ of the B1 connection point $P_{B1}$ are monitored by the integral control section 35.

Further, the second battery pack 21B includes the A2 switch $S_{A2}$, the A2 connection point $P_{A2}$, the four battery modules 11A01-11D01, the B1 connection point $P_{B2}$ and the B1 switch $S_{B2}$ connected in this order between the positive terminal 39a and the relay point $P_{md}$. The potential $V_{A2}$ of the A2 connection point $P_{A2}$ and the potential $V_{B2}$ of the B2 connection point $P_{B2}$ are monitored by the integral control section 35.

It is assumed that the battery block 33-4 according to Fourth Embodiment has all the switches $S_{A1}$, $S_{B1}$, $S_{A2}$ and $S_{B2}$ closed, that, as shown in FIG. 5B, the battery block 33-4 is composed of the first battery pack 21A and the second battery pack 21B connected in series and that the second battery pack 21B is positioned higher (has a higher potential) than the first battery pack 21A.

In this case, the potential $V_{A1}$ of the A1 connection point $P_{A1}$ and the potential $V_{B2}$ of the B2 connection point $P_{B2}$ are equal to each other, and the potential $V_{A2}$ of the A2 connection point $P_{A2}$ and the potential $V_{B1}$ of the B1 connection point $P_{B1}$ are different from each other. Here, the former and the latter are referred to as Conditions 3 and 4, respectively.

Table 4 is the connection mode managing table 49 which shows how Conditions 3 and 4 correspond to the connection mode between the first battery pack 21A and the second battery pack 21B.

TABLE 4

| Condition 3 | Condition 4 | Connection Mode | Positioned Higher | Positioned Lower |
|---|---|---|---|---|
| $V_{A1} \approx V_{B2}$ | $V_{A2} \neq V_{B1}$ | Series Connection | Second Battery Pack | First Battery Pack |

In short, the integral control section 35 monitors the potential $V_{A1}$ of the A1 connection point $P_{A1}$ and the potential $V_{B2}$ of the B2 connection point $P_{B2}$, and the potential $V_{A2}$ of the A2 connection point $P_{A2}$ and the potential $V_{B1}$ of the B1 connection point $P_{B1}$, and determines whether or not Conditions 3 and 4 are satisfied in order to grasp and manage whether or not the first battery pack 21A and the second battery pack 21B are connected in series and the relative positional relationship between the first battery pack 21A and the second battery pack 21B (which of the first battery pack 21A and the second battery pack 21B is positioned higher).

Further, the integral control section 35 may modify the identifying information on each of the battery modules 11A00-11D00 of the first battery pack 21A and the identifying information on each of the battery modules 11A01-11D01 of the second battery pack 21B according to the connection mode between the first battery pack 21A and the second battery pack 21B thus grasped and managed.

The battery system of Fourth Embodiment enables grasp and management of whether or not the first battery pack 21A and the second battery pack 21B are connected in series and of the relative positional relationship between the first battery pack 21A and of the second battery pack 21B (which of the first battery pack 21A and the second battery pack 21B is positioned higher) by a simple procedure of determining whether or not Conditions 3 and 4 are satisfied.

Fifth Embodiment

Like the battery block 33-4 of Fourth Embodiment, a battery block 33 of Fifth Embodiment shown in FIG. 5C is composed of the pair of the first battery pack 21A and the second battery pack 21B connected in series between the positive terminal 39a and the negative terminal 39b.

In Fifth Embodiment, however, the arrangement order of the first battery pack 21A and the second battery pack 21B (which of the first battery pack 21A and the second battery pack 21B is positioned higher) is reversed from that in Fourth Embodiment.

The first battery pack 21A includes the A1 switch $S_{A1}$, the A1 connection point $P_{A1}$, the four battery modules 11A00-11D00, the B1 connection point $P_{B1}$ and the B1 switch $S_{B1}$ connected in this order between the positive terminal 39a and the relay point $P_{md}$. The potential $V_{A1}$ of the A1 connection point $P_m$ and the potential $V_{B1}$ of the B1 connection point $P_{B1}$ are monitored by the integral control section 35.

The second battery pack 21B includes the A2 switch $S_{A2}$, the A2 connection point $P_{A2}$, the four battery modules 11A01-11D01, the B1 connection point $P_{B2}$ and the B1 switch $S_{B2}$ connected in this order between the relay point $P_{md}$ and the negative terminal 39b. The potential $V_{A2}$ of the A2 connection point $P_{A2}$ and the potential $V_{B2}$ of the B2 connection point $P_{B2}$ are monitored by the integral control section 35.

It is assumed that the battery modules 11A00-11D00 of the first battery pack 21A have a capacity equal to that of the battery modules 11A01-11D01 of the second battery pack 21B.

It is assumed that the battery block 33-5 according to Fifth Embodiment has all the switches $S_{A1}$, $S_{B1}$, $S_{A2}$ and $S_{B2}$ closed, that as shown in FIG. 5C, the battery block 33-5 is composed of the first battery pack 21A and the second battery pack 21B connected to each other in series and that the first battery pack 21A is positioned higher (has a higher potential) than the second battery pack 21B.

In this case, the potential $V_{B1}$ of the B1 connection point $P_{B1}$ and the potential $V_{A2}$ of the A2 connection point $P_{A2}$ are equal to each other, and the potential $V_{B2}$ of the B2 connection point $P_{B2}$ and the potential $V_{A1}$ of the A1 connection point $P_{A1}$ are different from each other. Here, the former and the latter are referred to as Conditions 5 and 6, respectively.

Table 5 is the connection mode managing table 49 which shows how Conditions 5 and 6 correspond to the connection mode between the first battery pack 21A and the second battery pack 21B.

TABLE 5

| Condition 5 | Condition 6 | Connection Mode | Positioned Higher | Positioned Lower |
|---|---|---|---|---|
| $V_{B1} \approx V_{A2}$ | $V_{B2} \neq V_{A1}$ | Series Connection | First Battery Pack | Second Battery Pack |

In short, the integral control section 35 monitors the potential $V_{B1}$ of the B1 connection point $P_{B1}$ and the potential $V_{A2}$ of the A2 connection point $P_{A2}$, and the potential $V_{B2}$ of the B2 connection point $P_{B2}$ and the potential $V_{A1}$ of the A1 connection point $P_{A1}$, and determines whether or not Conditions 5 and 6 are satisfied in order to grasp and manage whether or not the first battery pack 21A and the second battery pack 21B are connected in series and the relative positional relationship between the first battery pack 21A and the second battery pack 21B (which of the first battery pack 21A and the second battery pack 21B is positioned higher).

Further, the integral control section 35 may modify the identifying information on each of the battery modules 11A00-11D00 of the first battery pack 21A and the identifying information on each of the battery modules 11A01-11D01 of the second battery pack 21B according to the connection mode(s) between the first battery pack 21A and the second battery pack 21B thus grasped and managed.

The battery system of Fifth Embodiment enables grasp and management of whether or not the first battery pack 21A and the second battery pack 21B are connected in series and of the relative positional relationship between the first battery pack 21A and the second battery pack 21B (which of the first battery pack 21A and the second battery pack 21B is positioned higher) by a simple procedure of determining whether or not Conditions 5 and 6 are satisfied.

Other Embodiments

While preferred embodiments of the invention have been described, such descriptions are for illustrative purposes only, and it is to be understood that changes and variations may be made without departing from the spirit and scope of the invention.

In the embodiments, examples are given in which the first identifying information m1m2 is set by the identifying information setting section 25. However, the present invention is not limited to those examples. The first identifying information m1m2 may be stored in an information medium in the form of, for example, IP addresses, one- or two-dimensional bar codes, IC tag data and GPS positioning data, or any combination thereof.

Further, in the embodiments, examples are given in which the first identifying information m1m2 is set by relating values to their corresponding battery modules. However, the present invention is not limited those examples. The first identifying information m1m2 may be stored in an information medium in the form of, for example, one- or two-dimensional bar codes, serial numbers or the like, and adhesive seals carrying such one- or two-dimensional bar codes, serial numbers or the like may be attached to their corresponding battery modules.

Figure 6:
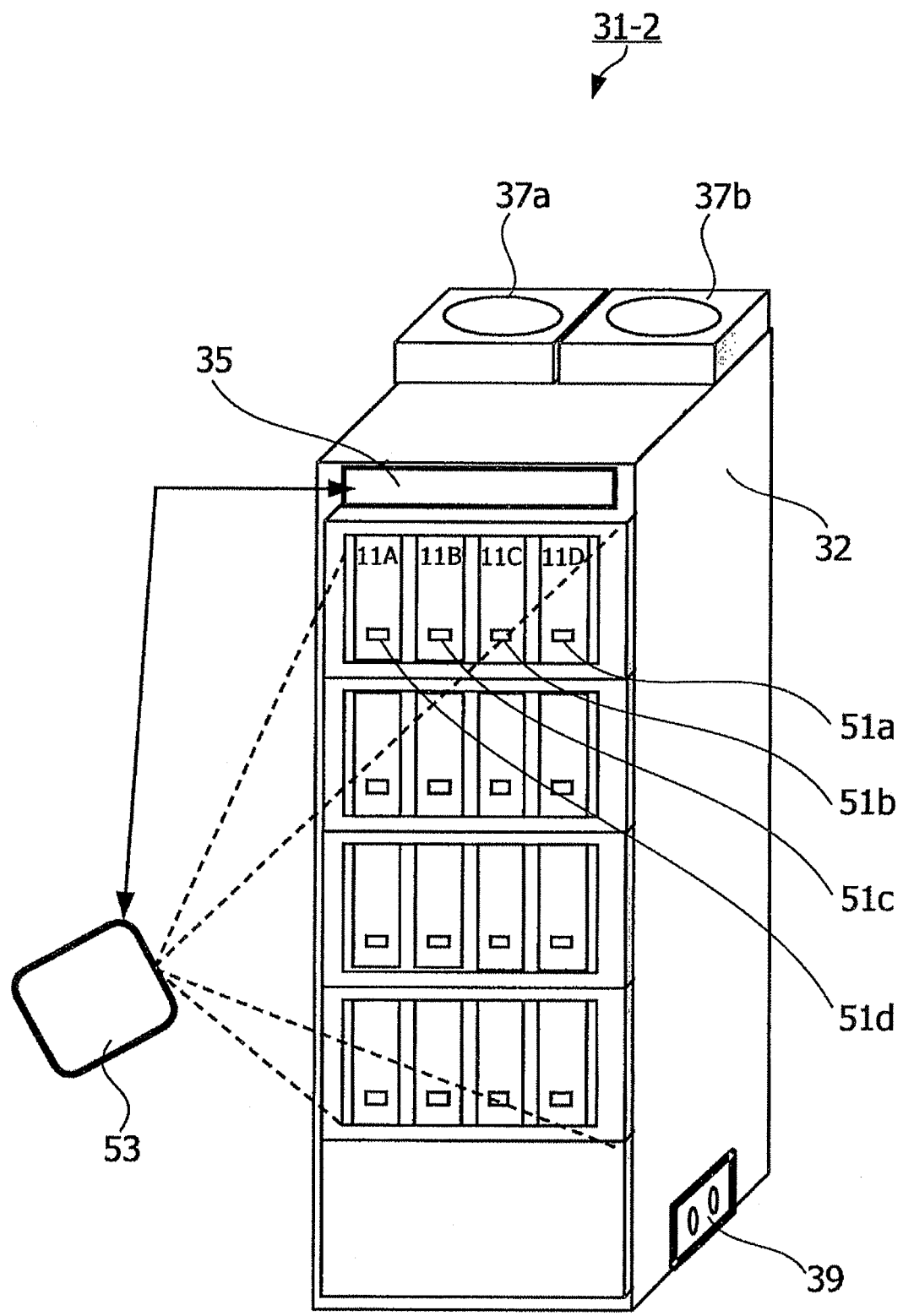
FIG. 6 A schematic view showing a procedure for reading out the identifying information from the outside of a battery block accommodating unit.

In adopting the above-mentioned system for storing the first identifying information m1m2, there is a problem of how to read out values assigned to the first identifying information m1m2, which is solved by providing a separate reader mechanism for reading out the values assigned to the first identifying information m1m2. FIG. 6 is a schematic view of a battery system provided with a separate reader mechanism according to a modification. In a battery block accommodating unit 3-2 according to the modification, as shown in FIG. 6, the values assigned to the first identifying information m1m2 are represented by two-dimensional bar codes 51a-51d provided on the front faces of the respective battery modules 11A-11D. The battery block accommodating unit 3-2 according to the modification is provided with a two-dimensional bar-code scanner (information reader equipped with a camera) 53 for reading out the values of the first identifying information m1m2.

With this configuration, it is easy to check whether or not the identifying information (address signal) is set properly by scanning the two-dimensional bar-code scanner 53 at the time of introduction, maintenance, maintenance replacement or the like of the battery system.

Further, in the embodiments, examples are given in which values to be assigned to the first identifying information m1m2 are determined based on the potentials of the respective battery modules 11A-11D. However, the present invention is not limited those examples. When a battery module is changed in potential, the value assigned to the first identifying information m1m2 on the battery module may be modified automatically according to the changed potential.

In the embodiments, examples are given in which each battery pack is composed of four battery modules which serve as the "battery elements". However, the present invention is not limited to those examples. There is no particular limitation on the upper limit of the number of "battery elements". If the number of "battery elements" is increased, the number of information bits for the first identifying information and second identifying information may be increased accordingly.

EXPLANATION OF REFERENCE NUMERALS

11A-11D Battery Module (Battery Element)
13 Battery Cell Monitoring Section
15a, 23A Identifying Information Signal Terminal Section
17A SCI
19A Power Source Circuit Terminal Section
21A-21D Battery Pack (Battery System)
25 Identifying Information Setting Section
31 Battery Block Accommodating Unit 3-2 Battery Block Accommodating Unit according to Modification
33-1 Battery Block according to First Embodiment
33-2 Battery Block according to Second Embodiment
33-3 Battery Block according to Third Embodiment
33-4 Battery Block according to Fourth Embodiment
33-5 Battery Block according to Fifth Embodiment
35 Integral Control Section
47 Connection Mode Managing Section
49 Connection Mode Managing Table
EC1, EC2, . . . , ECn Battery Cell

The invention claimed is:

1. A battery system comprising a plurality of battery elements connected to each other in either one or both of a series connection mode and a parallel connection mode, the battery system further comprising:
   an identifying information setting section for setting identifying information on each of the plurality of battery elements; and
   a connection mode managing section for managing a connection mode between the plurality of battery elements by using the identifying information set by the identifying information setting section,
   the identifying information on each of the plurality of battery elements comprising a combination of first identifying information on a potential of the battery element and second identifying information on a superordinate battery element to which the battery element belongs;
   the superordinate battery elements to which the plurality of battery elements belong include battery modules connected together in parallel; and
   in the battery modules connected in parallel, a same value is assigned to the first identifying information on battery elements having a substantially same potential;
   wherein the first identifying information is an address value.

2. The battery system of claim 1, wherein a same value is assigned to the second identifying information on battery elements belonging to a same superordinate battery element.

3. The battery system of claim 2, wherein different values are assigned to the second identifying information on battery elements belonging to different superordinate battery elements.

4. The battery system of claim 2, wherein the connection mode managing section grasps the battery elements belonging to the same superordinate battery element by using the second identifying information, and grasps a connection mode between the grasped battery elements by using the first identifying information to manage the connection mode between the plurality of battery elements.

5. The battery system of claim 1, wherein the first identifying information is stored in any one of information media in the form of an IP address, a one- or two-dimensional bar code, IC tag data and GPS positioning data or any combination thereof.

6. The battery system of claim 1, wherein when the potential of a battery element is changed, a value of first identifying information of the battery element is modified according to the potential possessed by the battery element after the change of the potential.

* * * * *